(12) United States Patent
Hoffman et al.

(10) Patent No.: US 8,912,055 B2
(45) Date of Patent: Dec. 16, 2014

(54) METHOD FOR MANUFACTURING A HYBRID MOSFET DEVICE AND HYBRID MOSFET OBTAINABLE THEREBY

(75) Inventors: Thomas Y. Hoffman, Leuven (BE); Matty Caymax, Leuven (BE); Niamh Waldron, Leuven (BE); Geert Hellings, Heverlee (BE)

(73) Assignee: IMEC, Leuven (BE)

( * ) Notice: Subject to any disclaimer, the term of this patent is extended or adjusted under 35 U.S.C. 154(b) by 224 days.

(21) Appl. No.: 13/462,694

(22) Filed: May 2, 2012

(65) Prior Publication Data

US 2012/0280326 A1 Nov. 8, 2012

Related U.S. Application Data

(60) Provisional application No. 61/482,129, filed on May 3, 2011.

(51) Int. Cl.

| | |
|---|---|
| H01L 21/00 | (2006.01) |
| H01L 29/66 | (2006.01) |
| H01L 29/78 | (2006.01) |
| H01L 21/28 | (2006.01) |
| H01L 29/10 | (2006.01) |
| H01L 21/8258 | (2006.01) |

(52) U.S. Cl.
CPC ...... *H01L 21/8258* (2013.01); *H01L 29/66651* (2013.01); *H01L 29/66636* (2013.01); *H01L 29/78* (2013.01); *H01L 21/28255* (2013.01); *H01L 29/1054* (2013.01)
USPC .................... 438/153; 438/459; 257/E21.642

(58) Field of Classification Search
USPC .......................................... 438/153, 218, 219
See application file for complete search history.

(56) References Cited

U.S. PATENT DOCUMENTS

| 5,064,781 | A | 11/1991 | Cambou et al. | |
|---|---|---|---|---|
| 5,593,915 | A * | 1/1997 | Ohoka | 438/153 |
| 5,894,152 | A | 4/1999 | Jaso et al. | |
| 7,749,829 | B2 * | 7/2010 | Karve et al. | 438/198 |
| 2002/0024094 | A1 | 2/2002 | Gao et al. | |
| 2004/0256700 | A1 | 12/2004 | Doris et al. | |

(Continued)

FOREIGN PATENT DOCUMENTS

WO   WO2008/148882 A2   12/2008

OTHER PUBLICATIONS

European Search Report, European Patent Application No. 12166646.5 dated Sep. 10, 2012.

*Primary Examiner* — Chandra Chaudhari
(74) *Attorney, Agent, or Firm* — McDonnell Boehnen Hulbert & Berghoff LLP

(57) ABSTRACT

Disclosed are methods for forming hybrid metal-oxide-semiconductor field effect transistors (MOSFETs) and the hybrid MOSFETS thus obtained. In one embodiment, a method is disclosed that includes providing a first substrate comprising a first region and a second region, providing a second substrate comprising a second semiconductor layer and an insulating layer overlaying the second semiconductor layer, and direct substrate bonding the second substrate to the first substrate, thereby contacting the first region and the second region with the insulating layer. The method further includes selectively removing the second semiconductor layer and the insulating layer in the first region, thereby exposing the first semiconductor layer in the first region, forming a first gate stack of a first MOSFET on the exposed first semiconductor layer in the first region, and forming a second gate stack of a second MOSFET on the second semiconductor layer in the second region.

15 Claims, 15 Drawing Sheets

(56) References Cited

U.S. PATENT DOCUMENTS

| | | |
|---|---|---|
| 2006/0049460 A1 | 3/2006 | Chen et al. |
| 2006/0172505 A1 | 8/2006 | Koester et al. |
| 2007/0181977 A1 | 8/2007 | Lochtefeld et al. |
| 2007/0252215 A1 | 11/2007 | Ieong et al. |
| 2008/0274594 A1 | 11/2008 | Karve et al. |
| 2008/0274595 A1 | 11/2008 | Spencer et al. |
| 2008/0283958 A1 | 11/2008 | Ohnuma |

* cited by examiner

METHOD FOR MANUFACTURING A HYBRID MOSFET DEVICE AND HYBRID MOSFET OBTAINABLE THEREBY

CROSS-REFERENCE TO RELATED APPLICATION

This application claims priority to U.S. Provisional Patent Application Ser. No. 61/482,129 filed May 3, 2011, the contents of which are hereby incorporated by reference.

BACKGROUND

High-mobility devices (e.g., Ge-channel, III-V compound-channel devices) are one of the device scaling options considered for 11 nm node and beyond. For System-on-Chip (SoC) applications, in order to meet all the different performance requirements (high performance core CMOS, periphery (analog, I/O), High-voltage devices, ESD, RF) at the same time it is believed that high-mobility devices will have to be co-integrated with standard Si Complementary Metal-Oxide-Semiconductor (CMOS) on silicon substrates.

One solution for pMOS is to form quantum well devices by growing a SiGe or Ge quantum well directly on Silicon. However, III-V compound devices, which have the highest potential for nMOS, need channel material such as, for example, InAs or InGaAs to deliver sufficiently high mobility. These later materials have very large lattice mismatch to silicon, hence requiring growth on a buffer or a stack of layers.

To avoid a loss of foot-print for III-V nMOS devices, the buffer has to be thin enough such that it can fit within a typical shallow trench isolation (STI) trench depth of about 250 to 300 nm. Also all the lattice mismatch defects have to be confined so that they do not propagate to the critical surface region.

SUMMARY

The requirement for the buffer to be thin enough to fit within a typical STI trench depth and the requirement that the lattice mismatch defects be confined are contradictory. Accordingly, alternative manufacturing methods are desired to circumvent these difficulties. Disclosed is an alternative method for manufacturing a hybrid MOSFET device. Using the disclosed method, the presence of a buffer layer in the hybrid MOSFET device can be avoided. Also disclosed is a hybrid MOSFET device with improved properties. The hybrid MOSFET device obtained using the disclosed method and the disclosed hybrid MOSFET device may comprise a first MOSFET having a first channel comprising a group IV semiconductor material and a second MOSFET having a second channel comprising a III-V compound material.

In one aspect, a method is disclosed that includes providing a first substrate comprising a first region, where the first region comprises a first semiconductor layer of a group IV semiconductor material, and a second region. The method further includes providing a second substrate comprising a second semiconductor layer of a III-IV semiconductor material and an insulating layer overlaying the second semiconductor layer. The method still further includes direct substrate bonding the second substrate to the first substrate, thereby contacting the first region and the second region with the insulating layer, and selectively removing the second semiconductor layer and the insulating layer in the first region, thereby exposing the first semiconductor layer in the first region. The method still further includes forming a first gate stack of a first metal-oxide-semiconductor field effect transistor (MOSFET) on the exposed first semiconductor layer in the first region and forming a second gate stack of a second MOSFET on the second semiconductor layer in the second region.

In some embodiments, the first semiconductor layer forms a channel of the first MOSFET. Similarly, in some embodiments, the second semiconductor layer forms a channel of the second MOSFET.

In some embodiments, the first gate stack and the second gate stack are formed substantially simultaneously.

In some embodiments, before direct substrate bonding the second substrate to the first substrate, a shallow trench isolation pattern is formed in the first substrate, thereby isolating the first region from the second region.

In some embodiments, the method further comprises, after direct substrate bonding the second substrate to the first substrate, forming a shallow trench isolation pattern in the first substrate, thereby isolating the first region from the second region.

In some embodiments, the second substrate further comprises a graded buffer layer, wherein the second semiconductor layer overlays the graded buffer layer. In these embodiments, selectively removing the second semiconductor layer and the insulating layer in the first region may comprise selectively removing the second semiconductor layer, the insulating layer, and the graded buffer layer in the first region.

In some embodiments, the first MOSFET is a p-MOSFET and the second MOSFET is an n-MOSFET.

In some embodiments, the method further comprises removing the second semiconductor layer, forming a first recess in the first substrate, forming a second recess in the first substrate, selectively epitaxially growing a doped group IV semiconductor material in each of the first recess and the second recess, forming a source contact in the first region, and forming a drain contact in the second region. In these embodiments, the source contact and the drain contact may be formed substantially simultaneously.

In some embodiments, the first semiconductor layer and the second semiconductor layer may be planarized prior to forming the first and second gate stacks.

Using the method described above, the III-V-on-insulator stack may be manufactured on a top side of a second substrate that is subsequently bonded to the top side of the first substrate. In this way, growth of the III-V compound material on a buffer or a stack of layers present in the first substrate, as is typically done, can be avoided. As a result, the need for such a buffer or stack of layers in the first substrate can be avoided. The resulting hybrid MOSFET devices may thus not contain such a buffer or stack of layers, may have a reduced thickness with respect to typical hybrid MOSFET devices, and may have fewer lattice-mismatch defects. Further, the disclosed method is fully CMOS compatible and avoids stress which would be built up during manufacturing using a buffer layer approach.

In another aspect, a method is disclosed that includes providing a first substrate comprising a first region, where the first region comprises a first semiconductor layer of a first group IV semiconductor material, and a second region. The method further comprises providing a second substrate comprising a second semiconductor layer of a III-IV semiconductor material and an insulating layer overlaying the second semiconductor layer, and direct substrate bonding the second substrate to the first substrate, thereby contacting the first region and the second region with the insulating layer. The method still further includes selectively removing the second semiconductor layer and the insulating layer in the first region, thereby exposing the first semiconductor layer in the first region, and growing a third semiconductor layer in the first region, where the third semiconductor layer comprises a second group IV semiconductor material. The method still further includes forming a first gate stack of a first metal-oxide-semiconductor field effect transistor (MOSFET) on the third semiconductor layer in the first region and forming a second gate stack of a second MOSFET on the second semiconductor layer in the second region.

In some embodiments, the third semiconductor layer forms a channel of the first MOSFET. Similarly, in some embodiments, the second semiconductor layer forms a channel of the second MOSFET.

In some embodiments, the first gate stack and the second gate stack are formed substantially simultaneously.

In some embodiments, the third semiconductor layer and the second semiconductor layer may be planarized prior to forming the first and second gate stacks.

In yet another aspect, a hybrid metal-oxide-semiconductor field effect transistor (MOSFET) device is disclosed that includes a substrate comprising a first region, where the first region comprises a first semiconductor layer of a group IV semiconductor material, and a second region. The hybrid MOSFET device further includes a second semiconductor layer of a III-IV semiconductor material overlaying the second region, an insulating layer overlaying the second semiconductor layer, a first gate stack of a first MOSFET formed on the first semiconductor layer in the first region, and a second gate stack of a second MOSFET formed on the second semiconductor layer in the second region.

In some embodiments, the group IV semiconductor material comprises at least one of silicon and germanium.

In some embodiments, the insulating layer comprises an oxide. In these embodiments, the oxide may be silicon oxide or aluminum oxide.

In some embodiments, the second semiconductor layer and the insulating layer have a combined thickness less than 15 nm.

In some embodiments, the hybrid MOSFET device may further include a third MOSFET. A channel region of the third MOSFET may comprise a group IV semiconductor material. In these embodiments, the third MOSFET may be similar to the first MOSFET and may be formed substantially simultaneously with the first MOSFET.

BRIEF DESCRIPTION OF THE DRAWINGS

The disclosure will be further elucidated by means of the following description and the appended figures.

DETAILED DESCRIPTION

Figure 1A:
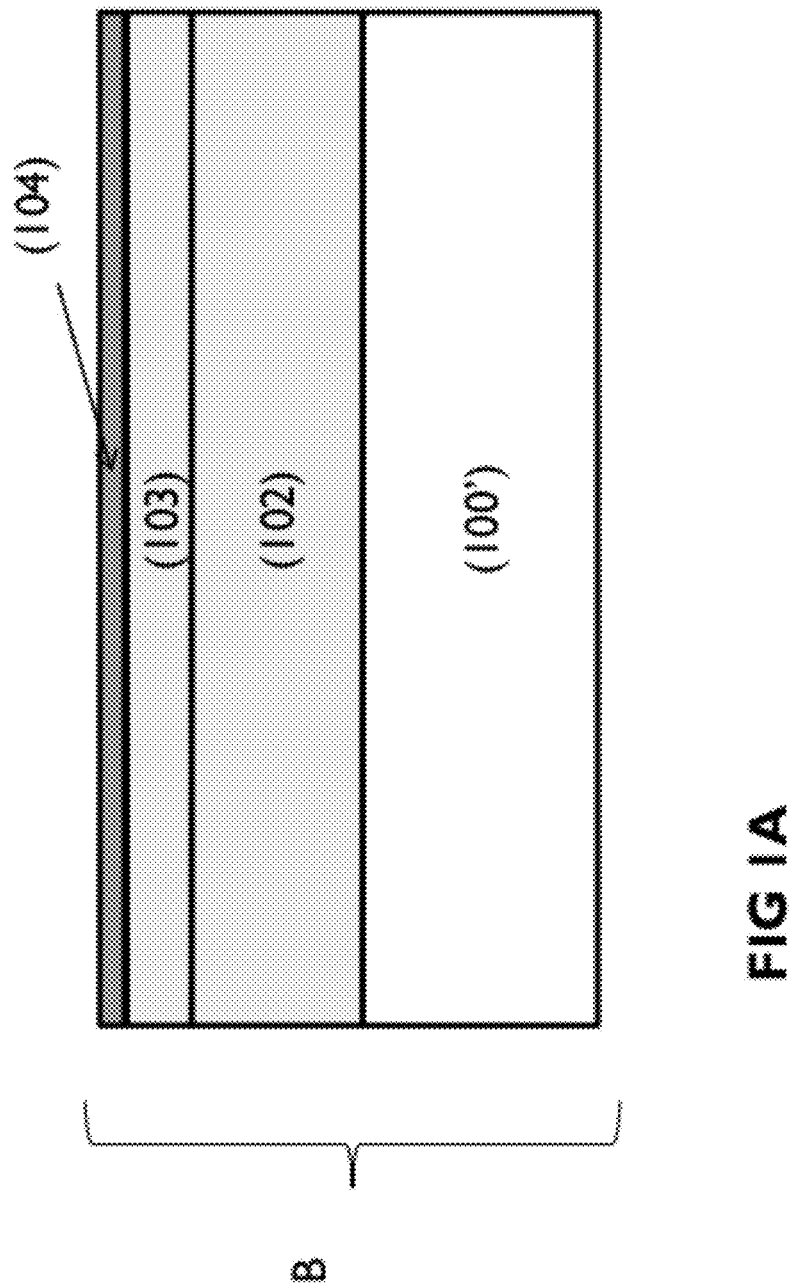
FIGS. 1A-C schematically illustrate direct wafer bonding, in accordance with some embodiments.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Below, a number of methods for manufacturing a hybrid MOSFET device comprising a first MOSFET having a first channel comprising a group IV semiconductor material and a second MOSFET having a second channel comprising a III-V compound material are disclosed. In some embodiments, the device may further comprise a third MOSFET having a third channel comprising a group IV semiconductor material.

In some embodiments, a hybrid integration scheme for CMOS processing technology may be used, whereby nMOS high mobility devices having a channel comprising a III-V compound material are fabricated on the same substrate at the same time as pMOS high mobility devices and/or CMOS periphery devices. The nMOS high mobility devices may be fabricated on regions of the substrate with buried Insulator (III-V on insulator), while the other devices (that is, the pMOS high mobility devices and/or CMOS periphery devices) may be fabricated directly on bulk Si. In some embodiments, the pMOS high mobility devices may have a germanium-comprising channel. Further, in some embodiments, the CMOS periphery devices have a silicon-comprising channel.

Figure 1B:
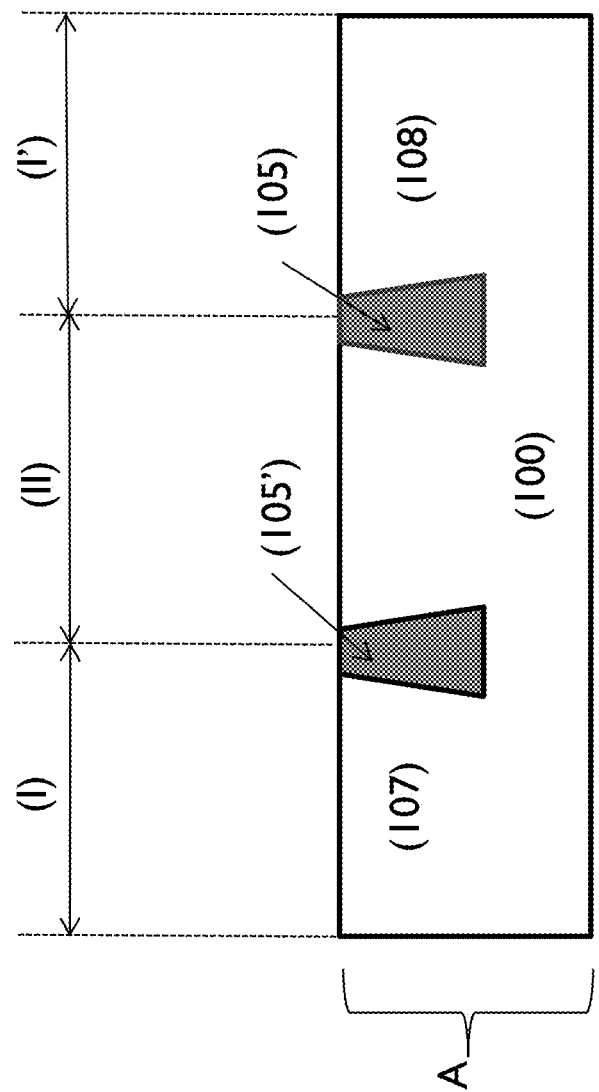
Figure 1C:
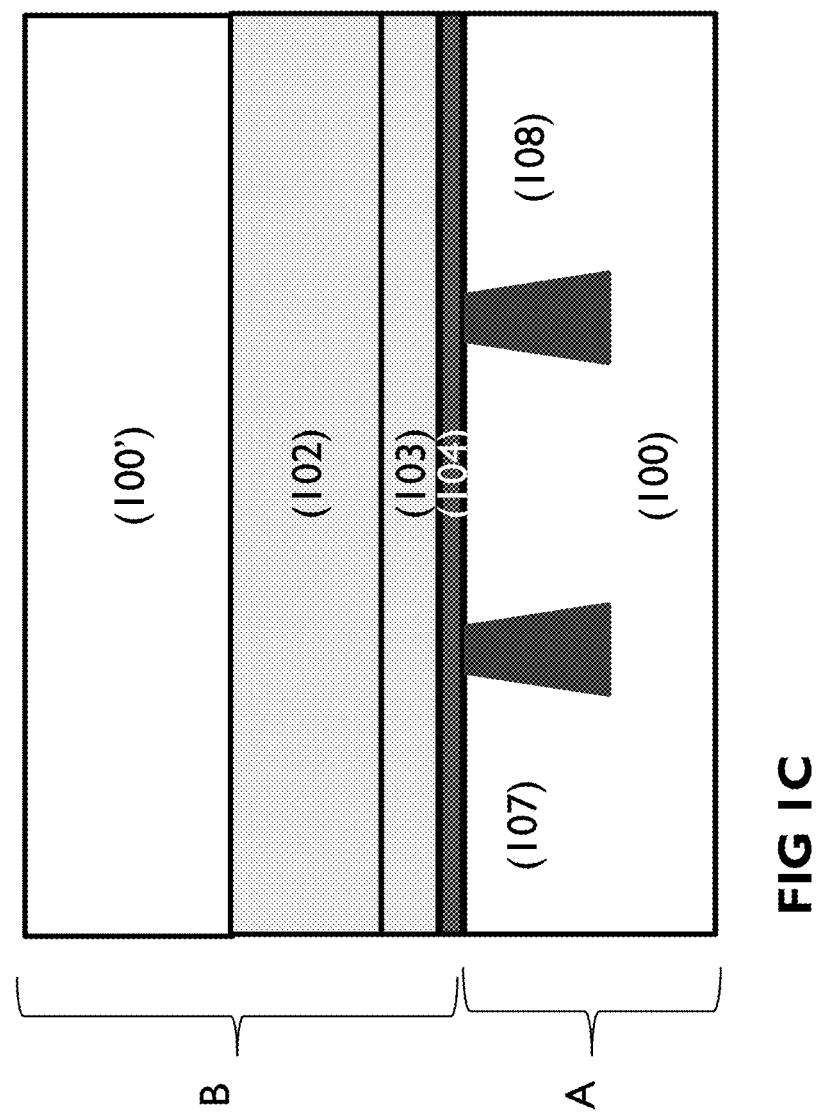
Figure 1D:
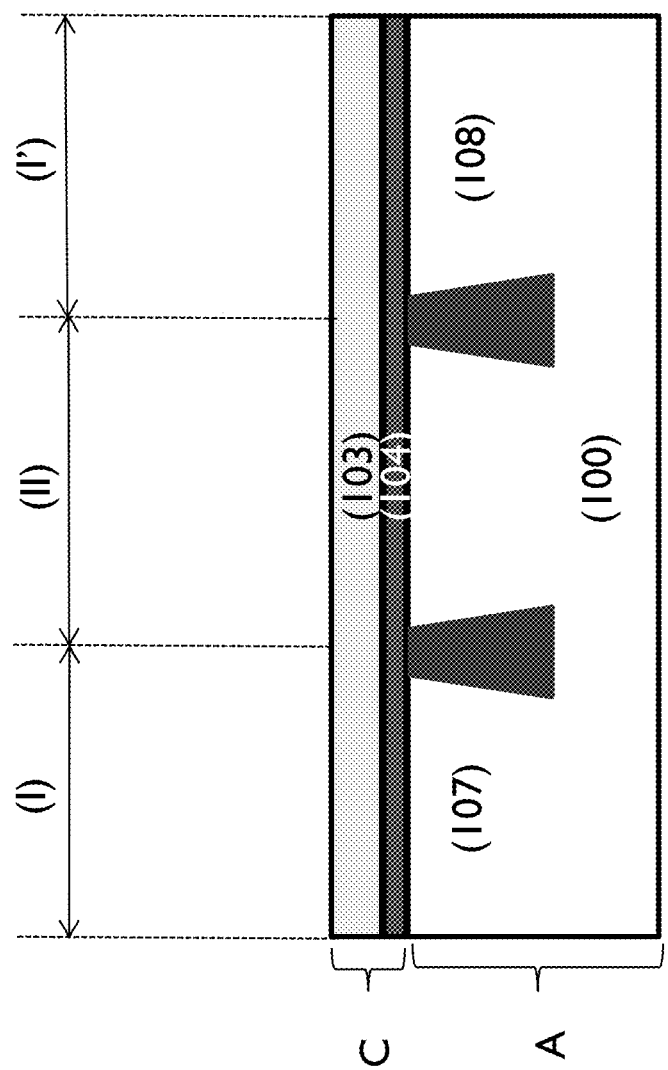
FIGS. 1D-F schematically illustrate a method for manufacturing a hybrid MOSFET, in accordance with some embodiments.
Figure 1E:
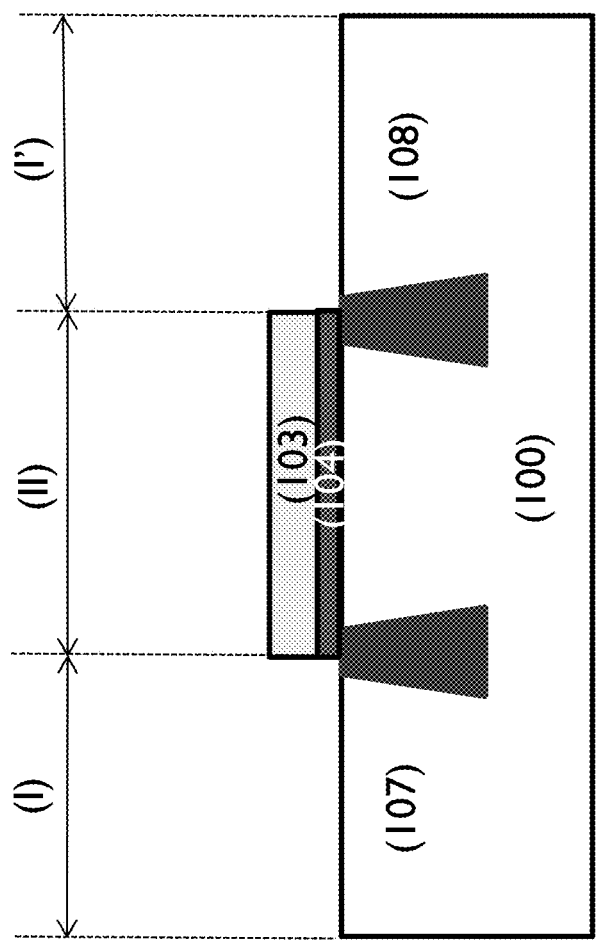
Figure 1F:
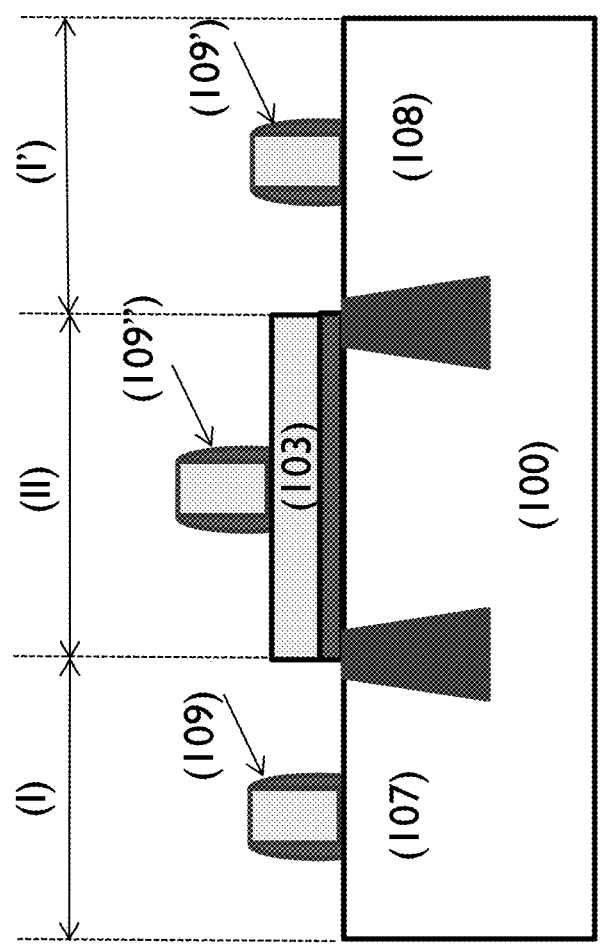

A method for manufacturing a hybrid MOSFET is described with reference to FIGS. 1A-F. FIGS. 1A-C schematically illustrate direct wafer bonding, in accordance with some embodiments. FIGS. 1D-F schematically illustrate a method for manufacturing a hybrid MOSFET, in accordance with some embodiments.

As shown in FIG. 1A, a III-V-on-insulator stack is manufactured on a separate substrate. This separate substrate, referred to herein as the second substrate or handle wafer, comprises a stack of a substrate layer (100'), a graded buffer layer (102), a III-V compound layer (103) that forms the III-V compound active layer, and an insulator layer (104).

The substrate layer (100') can be, for example, a Si substrate (wafer). The buffer layer (102) and the III-V compound layer (103) may be grown epitaxially on the substrate layer (100').

Further, the graded buffer layer (102) can comprise one or more sub-layers, each of which comprises a binary or a tertiary III-V compound. In some embodiments, a sub-layer of the graded buffer layer (102) may function as an etch stop layer. That is, in some embodiments a sub-layer of the graded buffer layer (102) may be removable with a different chemistry than the substrate layer (100') and the layers of the graded buffer layer in between the substrate (100') and the etch stop layer.

Further, the III-V layer (103) may comprise one or more sub-layers, each sub-layer comprising a binary or tertiary III-V compound. In some embodiments, the III-V layer (103) may comprise, for example, InGaAs and/or InAs.

The insulator layer (104) may be, for example, an oxide suitable to function as dielectric bonding layer. In some embodiments, the insulator layer (104) may comprise, for example, silicon oxide or aluminum oxide.

As shown in FIG. 1B, a first substrate (100) (e.g., a device wafer) is provided. The first substrate may be, for example, a bulk semiconductor substrate. A first region (I, I') and a second region (II) may be created by defining a shallow trench isolation pattern (105, 105') in the first substrate (100). In some embodiments, the group IV semiconductor material (107, 108) may comprise silicon and/or germanium. Further, in some embodiments, the group IV semiconductor material (107, 108) may be germanium.

FIG. 1C shows the direct substrate bonding of the first substrate (A), shown in FIG. 1B, with the second substrate (B), shown in FIG. 1A, to form a III-V-on-insulator stack (C) on the first substrate (A). The III-V-on-insulator stack (C) may comprise the insulating layer (104) overlying and in contact with the first substrate (A) over the first region (I, I') and a second region (II) and the III-V layer (103) overlying and in contact with the insulator layer (104) over the first region (I, I') and the second region (II). The III-V-on-insulator stack (C) is shown in FIG. 1D.

As shown in FIG. 1D, the semiconductor substrate (100') and the graded buffer layer (102) may be removed (e.g., etched) after the direct substrate bonding, to expose the III-V layer. Further, as shown in FIG. 1E, the III-V layer (103) and the insulator layer (104) may be selectively removed in the first region (I, I'), thereby exposing the semiconductor layer (107, 108) in the first region (I, I').

FIG. 1F shows the steps of forming first and third gate stacks (109, 109') of first and third MOSFETs on the exposed semiconductor material in the first region (I, I'). Additionally, FIG. 1F shows forming a second gate stack (109") of the second MOSFET on the III-V layer in the second region (II). In some embodiments, some or all of the first, second, and third gate stacks (109, 109", 109') may be formed substantially simultaneously.

Figure 2A:
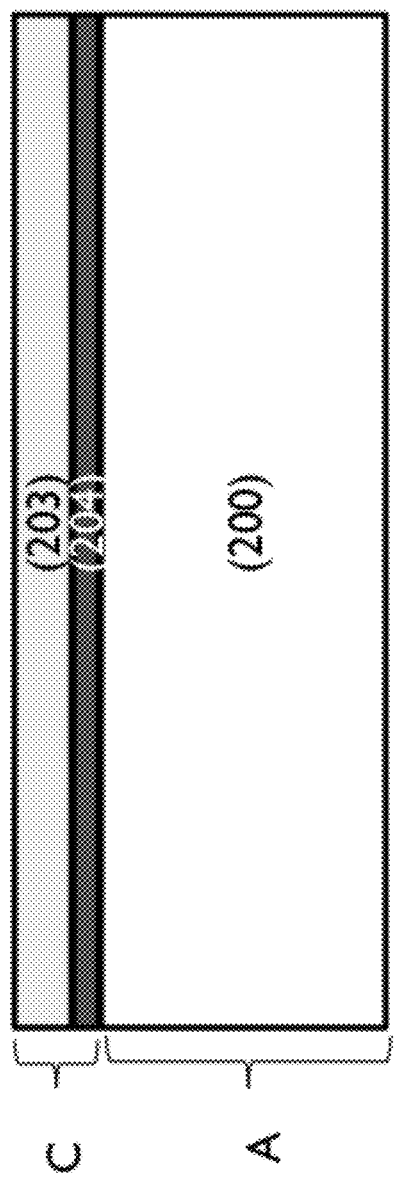
FIGS. 2A-E schematically illustrate another method for manufacturing a hybrid MOSFET, in accordance with some embodiments.
Figure 2B:
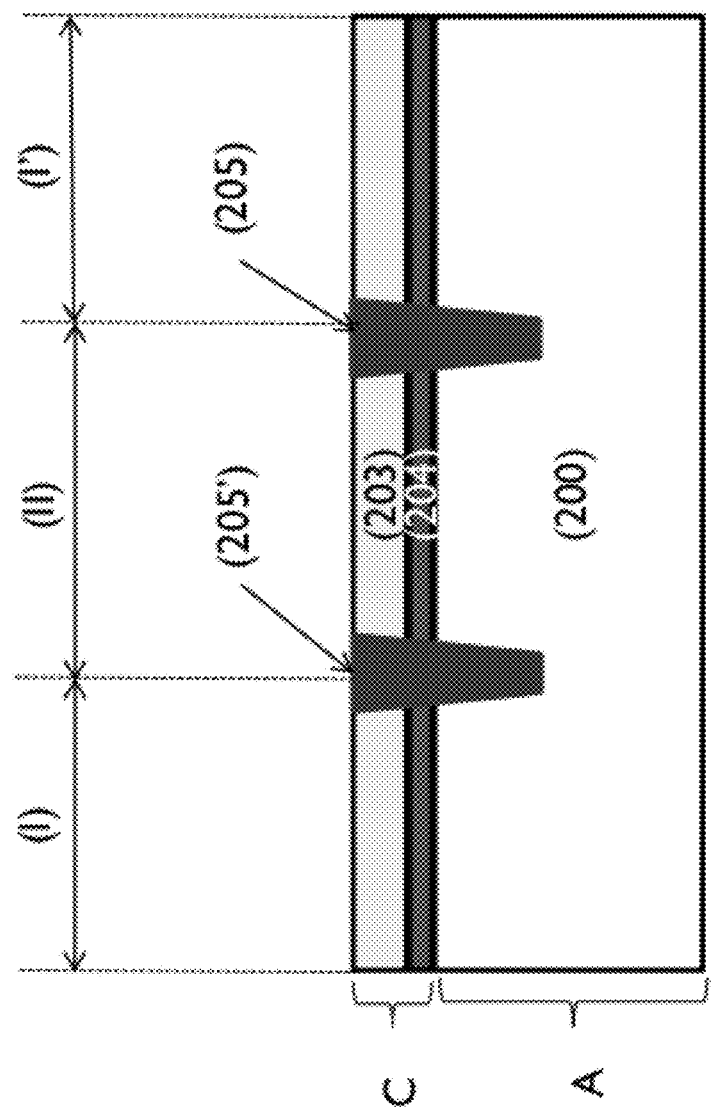
Figure 2C:
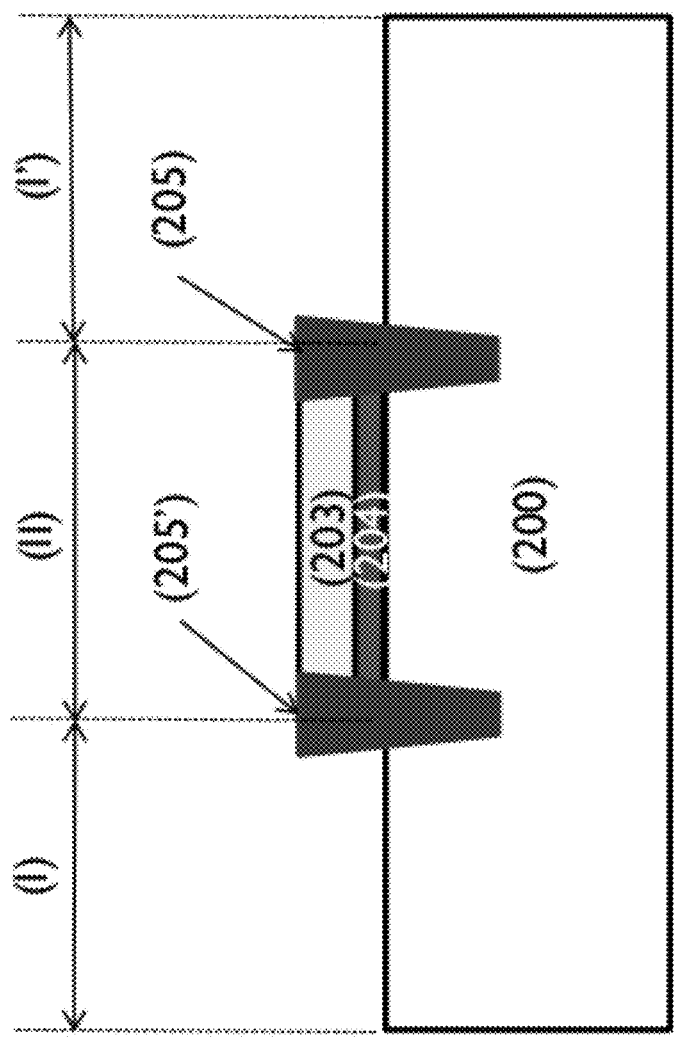
Figure 2D:
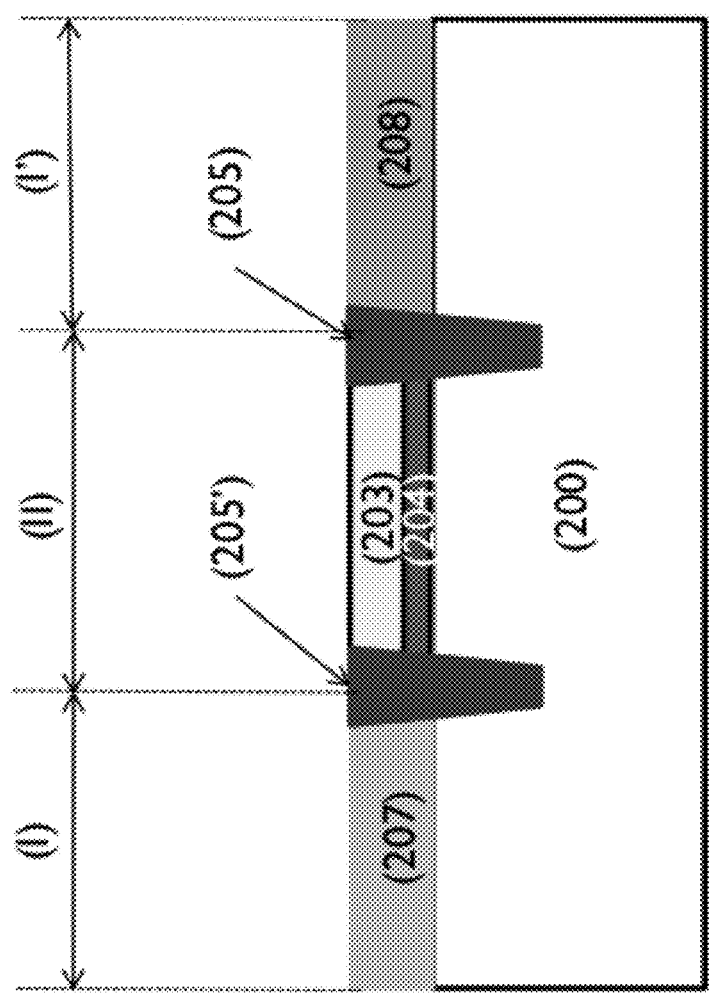
Figure 2E:
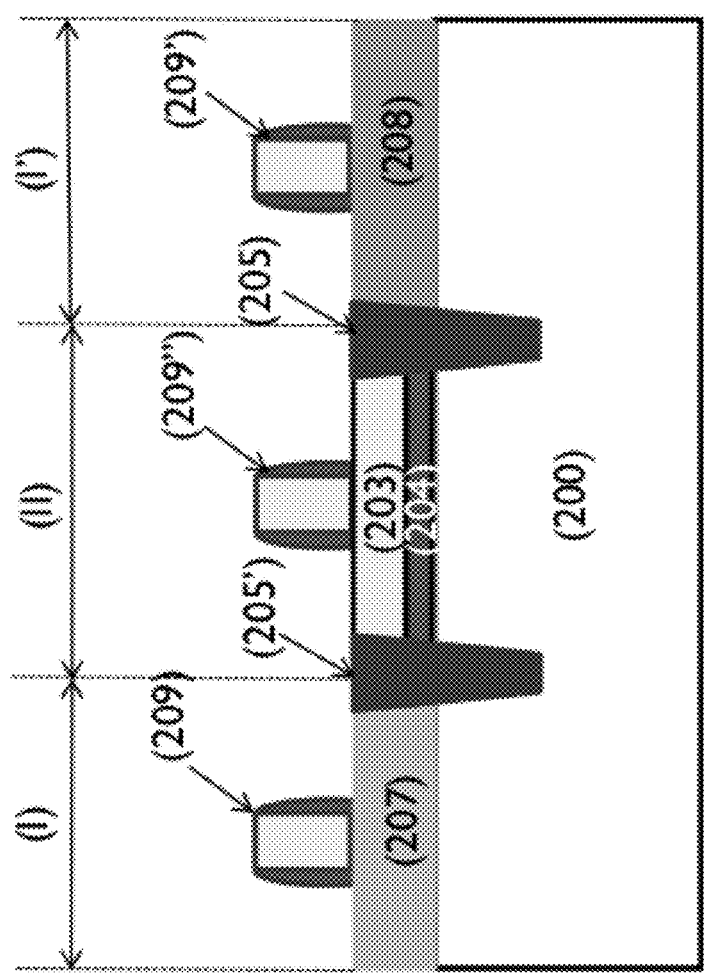

As shown in FIGS. 1A-F, the shallow trench isolation pattern (105, 105') is defined in the semiconductor substrate (100) before (prior to the formation of) the III-V-on-insulator stack (C) on the substrate (100). In other embodiments, however, such as those shown in FIGS. 2A-B, the shallow trench isolation pattern (205, 205') may also be defined after the III-V-on-insulator stack (C, 203-204)) is bonded to the substrate (200).

Further, as shown in FIGS. 1A-F, the first and third gate stacks (109, 109') are formed directly on top of the semiconductor material of the substrate (100), exposed by the removal of the III-V-on insulator stack in the second region (II). In other embodiments, however, such as those shown in FIGS. 2C-E, a second group IV semiconductor material (207, 208) may be subsequently grown on the semiconductor substrate on the first region (I, I') after removing the III-V-on-insulator stack (C) in the first region (I, I'). The second group IV semiconductor material may be suitable to function as the first channel material. In some embodiments, the second group IV semiconductor material (207, 208) may comprise silicon and/or germanium. As shown in FIGS. 2A-E, the structure may be further planarized prior to the formation of the gate stacks (209, 209', 209").

In some embodiments, the first MOSFET may be a p-MOSFET and the second MOSFET may be an n-MOSFET. Further, in some embodiments, the hybrid MOSFET device may comprise a third MOSFET on a third region (I'). In these embodiments, the first and the second MOSFET may be formed on, respectively, the first (I) and the second region (II), as described above, and may form together a high performance CMOS (core) device. The third MOSFET (e.g., a CMOS periphery) may be formed directly on the Si bulk substrate (100, 200, 300). The gate patterning and the further process integration of the three MOSFETs may be performed at the same time.

An additional integration challenge is the formation of good contacts regions with an integration scheme. It may be desirable for such an integration scheme to be compatible with the other devices like Si- or SiGe-based devices, which typically use silicide contacting schemes, such as, for example, NiSi. FIGS. 3A-D illustrate an example scheme to overcome this challenge.

Figure 3A:
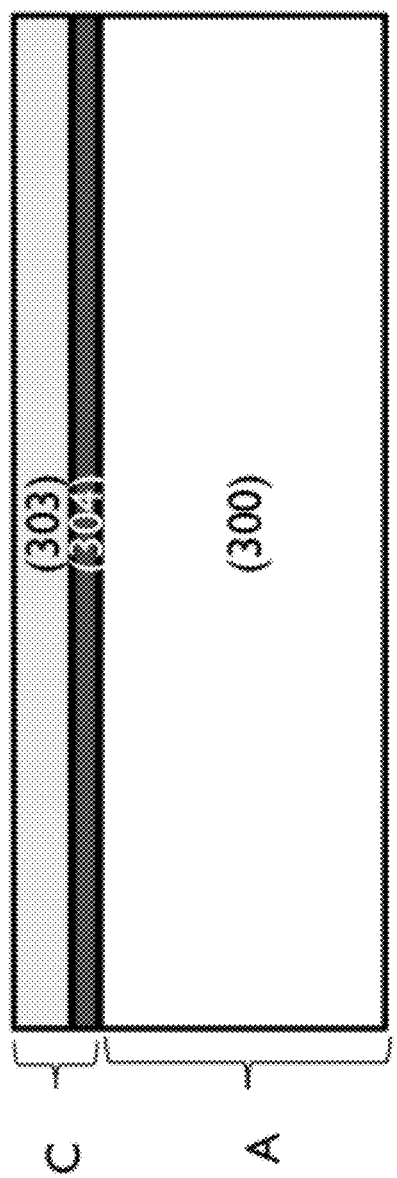
FIG. 3A-D schematically illustrate a method for forming S/D contacts substantially simultaneously on the first and the second MOSFET, in accordance with some embodiments.
Figure 3B:
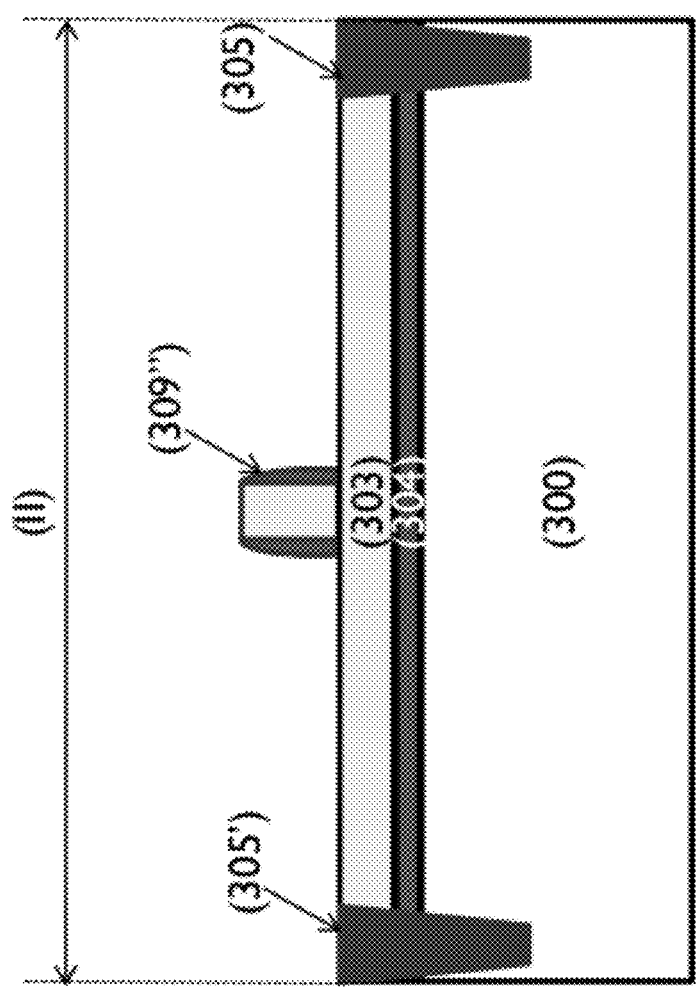
Figure 3C:
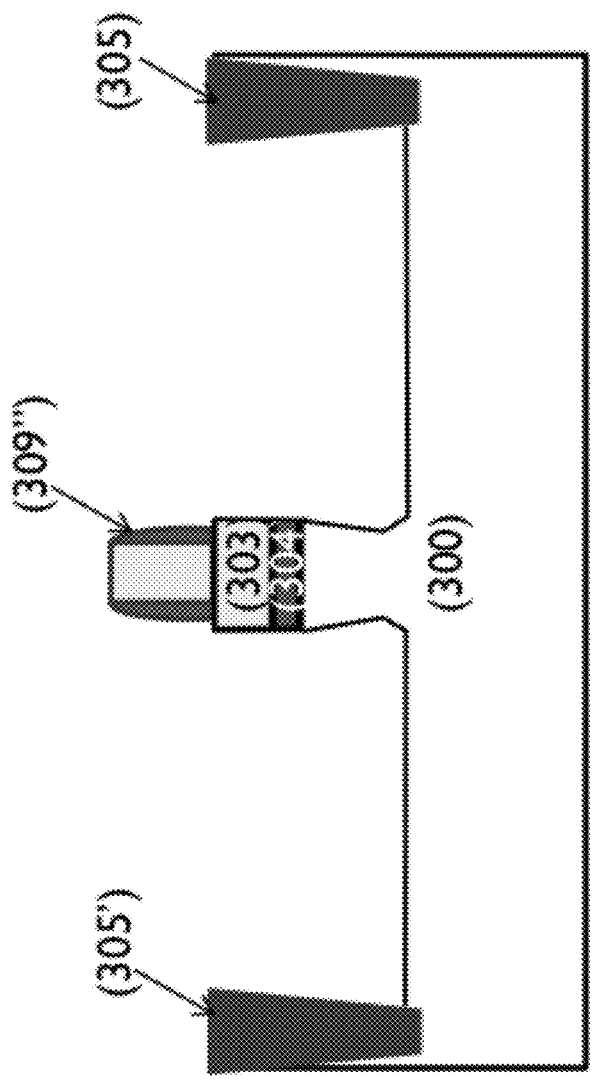
Figure 3D:
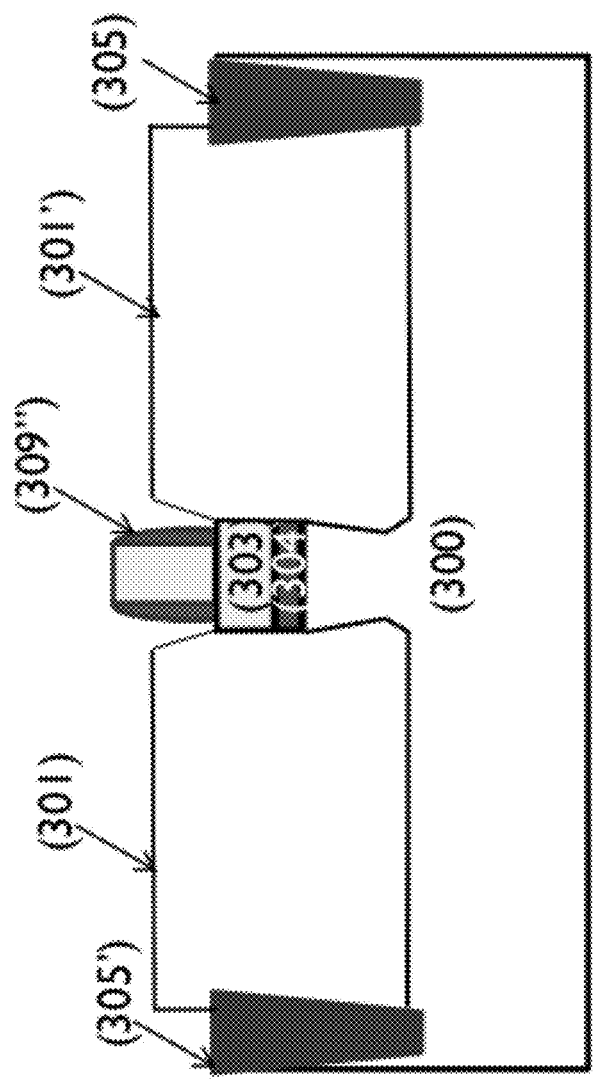

As shown in FIG. 3C, the III-V-on-insulator stack (C) may be further removed and a recess may be created in the semiconductor substrate (300) in the areas corresponding to a source (S) and a drain (D) of the second MOSFET (II). Thereafter, a doped group IV semiconductor material may be selectively epitaxially re-grown in each of the source (301) and the drain (301') recesses of the second MOSFET. Further, source and drain contacts may be formed substantially simultaneously on the first and the second MOSFET.

These additional process steps may enable use of the same contacting scheme for both the high mobility devices and the Si CMOS periphery devices, e.g., Ni-silicide. In some embodiments, the process conditions for the epitaxial re-growth of the S/D regions may be adapted such that the growth temperature is compatible with the III-V channel material.

In some embodiments, the III-V-on-insulator stack (C) may have a total thickness lower than 15 nm, or lower than 10 nm. In other words, the sum of the thickness of the insulator layer (104) and the III-V layer (103) may be lower than 15 nm, or lower than 10 nm. A total thickness of the III-V-on-insulator stack (C) lower than 15 nm allows the patterning of the gate stacks of the first and second MOSFET to be performed substantially simultaneously, simplifying significantly the integration scheme.

The invention claimed is:
1. A method comprising:
providing a first substrate comprising:
    a first region, wherein the first region comprises a first semiconductor layer of a group IV semiconductor material, and
    a second region;

providing a second substrate comprising a second semiconductor layer of a III-V semiconductor material and an insulating layer overlaying the second semiconductor layer;

direct substrate bonding the second substrate to the first substrate, thereby contacting the first region and the second region with the insulating layer;

selectively removing the second semiconductor layer and the insulating layer above the first region, thereby exposing the first semiconductor layer in the first region;

forming on the exposed first semiconductor layer a first gate stack corresponding to a first metal-oxide-semiconductor field effect transistor (MOSFET); and forming above the second region and on the second semiconductor layer a second gate stack corresponding to a second MOSFET.

2. The method of claim 1, wherein the first semiconductor layer forms a channel of the first MOSFET.

3. The method of claim 1, wherein the second semiconductor layer forms a channel of the second MOSFET.

4. The method of claim 1, wherein the first gate stack and the second gate stack are formed substantially simultaneously.

5. The method of claim 1, further comprising, before direct substrate bonding the second substrate to the first substrate, forming a shallow trench isolation pattern in the first substrate, thereby isolating the first region from the second region.

6. The method of claim 1, further comprising, after direct substrate bonding the second substrate to the first substrate, forming a shallow trench isolation pattern in the first substrate, thereby isolating the first region from the second region.

7. The method of claim 1, wherein the second substrate further comprises a graded buffer layer, wherein the second semiconductor layer overlays the graded buffer layer.

8. The method of claim 7, wherein selectively removing the second semiconductor layer and the insulating layer above the first region comprises selectively removing the second semiconductor layer, the insulating layer, and the graded buffer layer above the first region.

9. The method of claim 1, wherein:
the first MOSFET is a p-MOSFET; and
the second MOSFET is an n-MOSFET.

10. The method of claim 1, further comprising:
removing a portion of the second semiconductor layer around the second gate stack, thereby exposing the first substrate in a portion of the second region;
forming a first recess in the exposed first substrate;
forming a second recess in the exposed first substrate;
selectively epitaxially growing a doped group IV semiconductor material in each of the first recess and the second recess;
forming a source contact in the first recess; and
forming a drain contact in the second recess.

11. The method of claim 10, wherein the source contact and the drain contact are formed substantially simultaneously.

12. A method comprising:
providing a first substrate comprising:
a first region, wherein the first region comprises a first semiconductor layer of a first group IV semiconductor material, and
a second region;
providing a second substrate comprising a second semiconductor layer of a III-V semiconductor material and an insulating layer overlaying the second semiconductor layer;
direct substrate bonding the second substrate to the first substrate, thereby contacting the first region and the second region with the insulating layer;
selectively removing the second semiconductor layer and the insulating layer above the first region, thereby exposing the first semiconductor layer in the first region;
growing a third semiconductor layer on the exposed first semiconductor layer, wherein the third semiconductor layer comprises a second group IV semiconductor material that is different from the first group IV semiconductor material;
forming on the third semiconductor layer a first gate stack corresponding to a first metal-oxide-semiconductor field effect transistor (MOSFET); and
forming on the second semiconductor layer a second gate stack corresponding to a second MOSFET.

13. The method of claim 12, wherein the third semiconductor layer forms a channel of the first MOSFET.

14. The method of claim 12, wherein the second semiconductor layer forms a channel of the second MOSFET.

15. The method of claim 12, wherein the first gate stack and the second gate stack are formed substantially simultaneously.

* * * * *